(12) United States Patent
Elsayed

(10) Patent No.: US 11,264,111 B2
(45) Date of Patent: Mar. 1, 2022

(54) REDUCED-LEAKAGE APPARATUS FOR SAMPLING ELECTRICAL SIGNALS AND ASSOCIATED METHODS

(71) Applicant: Silicon Laboratories Inc., Austin, TX (US)

(72) Inventor: Mohamed M. Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/676,757

(22) Filed: Aug. 14, 2017

(65) Prior Publication Data
US 2019/0051366 A1 Feb. 14, 2019

(51) Int. Cl.
*G11C 27/02* (2006.01)
*H03K 17/687* (2006.01)

(52) U.S. Cl.
CPC ............ *G11C 27/02* (2013.01); *G11C 27/024* (2013.01); *H03K 17/687* (2013.01)

(58) Field of Classification Search
CPC ..... G11C 27/024; G11C 27/026; G11C 27/02; G11C 5/025; H03K 17/162; H03K 17/165; H03K 17/302; H03K 17/687; H03K 17/063; H03K 17/693; H03K 17/6872; H03K 3/356113; H03K 2217/0018; H03K 2217/0054; G05F 3/262
USPC .......................................... 327/91, 92, 93, 94
See application file for complete search history.

(56) References Cited

U.S. PATENT DOCUMENTS

| | | | |
|---|---|---|---|
| 5,343,089 A * | 8/1994 | Itakura | G11C 27/026 327/94 |
| 5,422,583 A | 6/1995 | Blake | |
| 5,945,872 A | 8/1999 | Robertson | |
| 6,265,911 B1 | 7/2001 | Nairn | |
| 6,329,848 B1 | 12/2001 | Maes | |
| 6,504,406 B1 | 1/2003 | Kakitani | |
| 6,577,168 B1 | 6/2003 | Kakitani | |
| 7,298,010 B1 | 11/2007 | Ma | |
| 7,532,042 B2 | 5/2009 | Lee | |
| 7,636,075 B2 | 12/2009 | Shin | |
| 7,812,646 B2 | 10/2010 | Augustyniak | |
| 8,115,518 B1 | 2/2012 | Ali | |
| 8,415,985 B2 | 4/2013 | Cheeranthodi | |
| 8,723,556 B2 | 5/2014 | Thomas | |
| 8,766,670 B2 * | 7/2014 | Chen | H03K 5/13 327/91 |
| 2002/0167343 A1 | 11/2002 | Erhart et al. | |

(Continued)

OTHER PUBLICATIONS

Analog Devices, "Sample-and-Hold Amplifiers, Introduction and Historical Perspective," 2009, 21 pgs.

(Continued)

*Primary Examiner* — John W Poos
(74) *Attorney, Agent, or Firm* — Law Offices of Maximilian R. Peterson

(57) ABSTRACT

An apparatus includes a sample-and-hold (S/H) circuit. The S/H circuit includes a first switch coupled to provide an input signal to be sampled, and a second switch coupled to the first switch and to a first capacitor. The S/H circuit further includes a third switch coupled to the second switch and to a second capacitor, and a fourth switch to selectively couple to ground a node between the first and second switches.

20 Claims, 13 Drawing Sheets

(56) References Cited

U.S. PATENT DOCUMENTS

| | | | |
|---|---|---|---|
| 2013/0285705 A1* | 10/2013 | Kabir | G11C 27/02 327/94 |
| 2016/0104543 A1* | 4/2016 | Powell | G11C 27/026 327/96 |
| 2017/0104480 A1 | 4/2017 | Eshel | |
| 2019/0123756 A1 | 4/2019 | Huang | |
| 2019/0156906 A1 | 5/2019 | Nomura | |
| 2019/0356874 A1 | 11/2019 | Eshel | |
| 2020/0090777 A1 | 3/2020 | Ivanov | |

OTHER PUBLICATIONS

Kim et al., "Sample & Hold Circuits," 2011, 22 pgs.
Balaz, "Versatile Sample & Hold Circuit for Industrial and T&M Applications," 2013, 24 pgs.
Intersil Application Note AN517.0, "Applications of Monolithic Sample-and-Hold Amplifiers," 2005, 5 pgs.
U.S. Appl. No. 15/676,731, Elsayed, filed Aug. 2017.
U.S. Appl. No. 15/676,743, Elsayed, filed Aug. 2017.
Office communication in U.S. Appl. No. 15/676,731, dated May 15, 2018.
Office communication in U.S. Appl. No. 15/676,731, dated Oct. 3, 2018.
Office communication in U.S. Appl. No. 15/676,731, dated Dec. 14, 2018.
Office communication in U.S. Appl. No. 15/676,743, dated May 16, 2018.
Office communication in U.S. Appl. No. 15/676,743, dated Sep. 27, 2018.
Office communication in U.S. Appl. No. 15/676,743, dated Dec. 14, 2018.
Office communication in U.S. Appl. No. 15/676,731, dated Apr. 16, 2019.
Office communication in U.S. Appl. No. 15/676,743, dated Apr. 3, 2019.
Office communication in U.S. Appl. No. 15/676,731, dated Aug. 12, 2019.
Office communication in U.S. Appl. No. 15/676,743, dated Jul. 29, 2019.

* cited by examiner

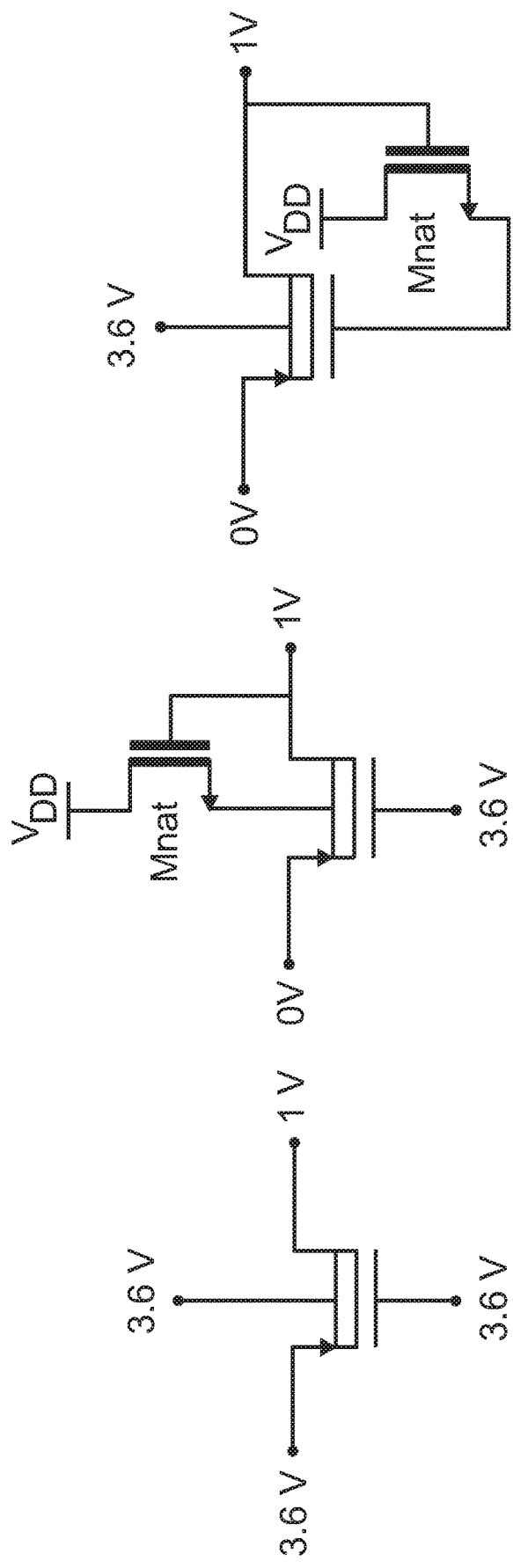

US 11,264,111 B2

REDUCED-LEAKAGE APPARATUS FOR SAMPLING ELECTRICAL SIGNALS AND ASSOCIATED METHODS

CROSS-REFERENCE TO RELATED APPLICATIONS

This application is related to, and incorporates by reference in their entireties for all purposes, the following concurrently filed applications: (a) U.S. patent application Ser. No. 15/676,731, titled "Apparatus for Sampling Electrical Signals with Improved Hold Time and Associated Methods," and (b) U.S. patent application Ser. No. 15/676,743, titled "Apparatus for Sampling Electrical Signals with Reduced Leakage Current and Associated Methods."

TECHNICAL FIELD

The disclosure relates generally to signal sampling circuitry and, more particularly, to apparatus for sample-and-hold (S/H) circuitry, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

In some situations, a circuit may use the value of an analog signal. Sometimes a S/H circuit is used to sample the level of the analog signal. The S/H circuit holds the sampled value until it is used by the circuit.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an S/H circuit. The S/H circuit includes a first switch coupled to provide an input signal to be sampled, and a second switch coupled to the first switch and to a first capacitor. The S/H circuit further includes a third switch coupled to the second switch and to a second capacitor, and a fourth switch to selectively couple to ground a node between the first and second switches.

According to another exemplary embodiment, an apparatus includes an S/H circuit. The S/H circuit includes a first metal oxide semiconductor field effect transistor (MOSFET) and a second MOSFET. The first and second MOSFETs are coupled in cascade to selectively provide power to a circuit. The apparatus further includes a native transistor. The native transistor is coupled to provide a gate voltage of the second MOSFET.

According to another exemplary embodiment, a method of using a sample and hold (S/H) circuit, having a sample mode and a hold mode, includes providing, by using a first switch, an input signal to be sampled, and using a second switch to provide the input signal to a first capacitor. The method further includes using a third switch to provide the input signal to a second capacitor, and selectively coupling, by using a fourth switch, to ground a node between the first and second switches.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

FIGS. 6A-6C show circuit arrangements used for characterizing leakage currents in S/H circuits.

DETAILED DESCRIPTION

The disclosed concepts relate generally to S/H circuits. More specifically, the disclosed concepts provide apparatus and methods for S/H circuits with improved performance.

Figure 1:
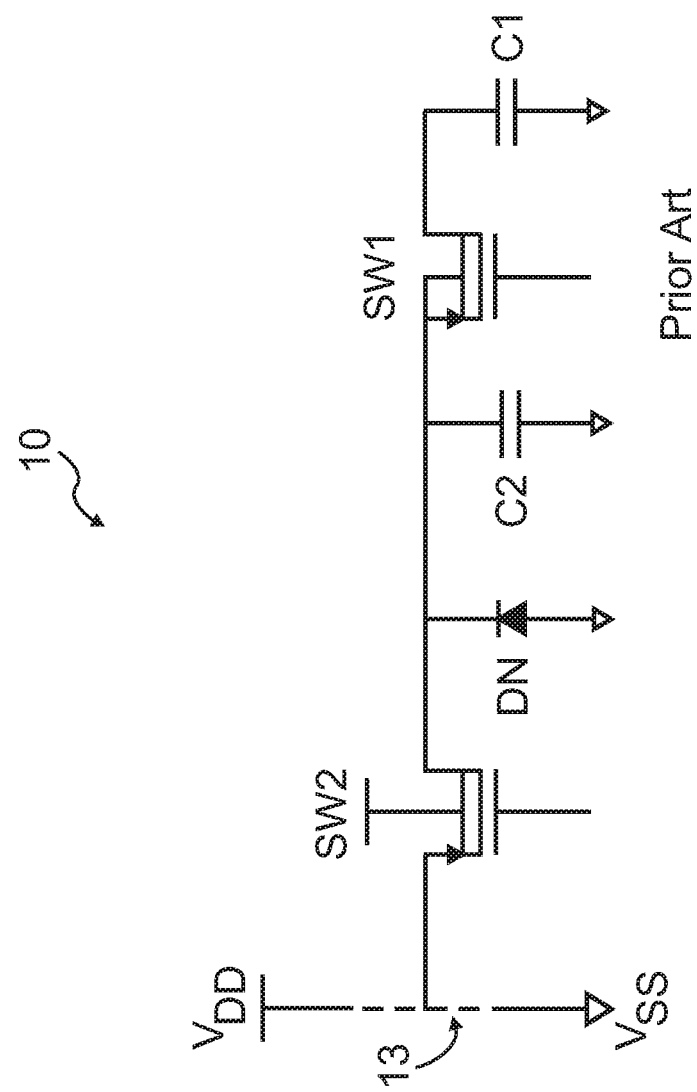
FIG. 1 shows a conventional S/H circuit.

FIG. 1 shows a conventional S/H circuit 10. S/H circuit 10 includes input circuit 13. Input circuit 13 may include one or more switches, current source, and the like, in order to sample the input voltage (not shown), as persons of ordinary skill in the art understand. By virtue of the operation of input circuit 13, the source of transistor SW2 may be coupled to the supply voltage ($V_{DD}$), the input voltage (to be sampled), or the ground voltage ($V_{SS}$), as persons of ordinary skill in the art understand.

As shown, S/H circuit 10 uses output capacitor, C1, and a sampling switch, SW1. In order to reduce the leakage current through transistor SW1, another capacitor, C2, and another transistor, SW2, are employed such that the voltage across transistor SW1 is zero. As a consequence, the current though transistor SW1 is zero or nearly zero, and the output node (the top plate of capacitor C1), will leak relatively small current, which allows the circuit to hold the sampled voltage.

The hold time of the output voltage of S/H circuit 10 is limited by the hold time of the intermediate capacitor, C2. The intermediate capacitor is subject to various types of leakage currents, which result in the decay of the output voltage and, thus, limit the hold time of the circuit.

Capacitor C2, at the intermediate node between transistor SW1 and transistor SW2, is subject to several types of leakage currents that, with the passage of time, cause drift in the voltage across capacitor C2. The leakage currents cause a decrease in the hold time of S/H circuit 10.

The leakage currents depend to some extent on the type of device(s) used to implement switches SW1 and SW2. Typically, switches SW1 and SW2 implemented using MOSFETs.

Use of MOSFETs to implement switches SW1 and SW2 results in several types of leakage current. The leakage currents include: (a) the drain-source leakage current ($I_{ds}$) of switch SW2; (b) the gate-induced leakage current ($I_{GIDL}$) of switch SW2; (c) the body-drain current ($I_{bd}$) of switch SW2; and (d) the leakage current through diode DN ($I_{DN}$).

Figure 2:
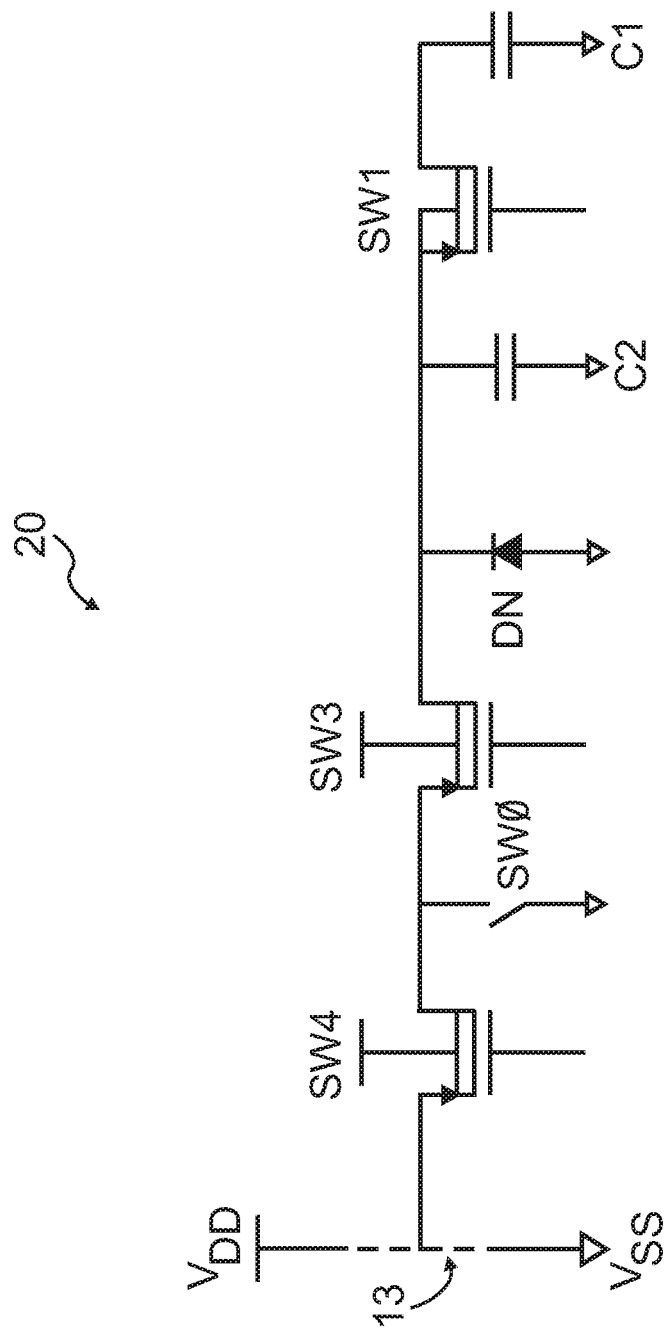
FIG. 2 shows a S/H circuit according to an exemplary embodiment.

FIG. 2 shows a S/H circuit 20 according to an exemplary embodiment. In the exemplary embodiment shown, the various switches are implemented as MOSFETs although, as persons of ordinary skill in the art will understand, other devices may be used.

Referring again to FIG. 2, S/H circuit 20 has decreased leakage current, and therefore improved or longer hold time. Specifically, the sub-threshold drain-source leakage current ($I_{ds}$) is induced when the channel of transistor SW2 (see FIG. 1) is not fully turned off (even though switch SW2 is open, i.e., the MOSFET implementing the switch is not turned off).

Even if the source-gate voltage ($V_{sg}$) of transistor SW2 is at least zero volts, the drain-source current is not zero, and is finite. The drain voltage is determined by the state of the input voltage, i.e., the value of the input voltage provided by input circuit 13, after the sampling phase or mode of operation of S/H circuit 20.

In order to eliminate (or reduce, in a practical implementation) the sub-threshold current, rather than use a single input switch SW2 (see FIG. 1), S/H circuit 20 in FIG. 2 uses two switches, i.e., switches SW3 and SW4, which in the exemplary embodiment shown are implemented using MOSFETs. S/H circuit 20 further uses switch SW0, implemented by using another MOSFET in the exemplary embodiment shown, to pull down the intermediate node between transistors SW3 and SW4, as described below in more detail.

By virtue of using the switch topology shown in the exemplary embodiment of FIG. 2, source-gate voltage of transistor SW3 is minus the supply voltage, i.e., $-V_{DD}$. As a result, the channel of transistor SW3 is turned off completely (or nearly completely in a practical, real-life implementation). Thus, the sub-threshold current is eliminated (or reduced, in a practical implementation), which increases the hold time of S/H circuit 20.

Referring again to FIG. 2, S/H circuit 20 has an improved (longer) hold time. The improved hold time of S/H circuit 20 can improve various figures of merit of a circuit (or block or subsystem or system or IC) that includes S/H circuit 20.

The improved hold time allows less frequent sampling of the input voltage (not shown). Thus, a host or controller that interfaces with S/H may use fewer clock cycles to sample the output voltage of S/H circuit 20, i.e., the voltage across capacitor C1, because the interval between reading the output voltage may be increased.

The improved hold time allows reduction of the power consumption of the circuit that includes S/H circuit 20 during a low-power (or sleep or hibernate or shutdown or power-down) mode of operation. More specifically, because S/H circuit 20 can maintain or hold the output voltage for a longer period, the circuit, or parts of the circuit, that includes S/H circuit 20 may be placed in a low-power mode for a longer period of time.

For instance, input circuit 13, which provides the voltage to be sampled to the S/H circuit, may be placed in a low-power mode (or sleep or hibernate or shutdown or power-down) after the sampling operation has taken place. In this case, the power consumption is eliminated almost entirely (except for non-ideal effects, such as leakage currents in various transistors in a practical implementation) because input circuit 13 is turned off, while the output voltage, which is stored on capacitor C1, is still available for use by other circuits (e.g., other circuits within or external to an IC that includes S/H circuit 20).

Transistors SW3 and switch SW4 selectively provide the input voltage (the voltage to be sampled) to capacitor C2 in order to sample the input voltage. During the sample mode of operation, i.e., when S/H circuit 20 samples the input voltage, switch SW0 is open, and transistors SW3 and SW4 are on and provide the input voltage (the voltage to be sampled) to transistor SW1, which provides the voltage to capacitor C1.

Conversely, during the hold mode of operation, i.e., when S/H circuit 20 holds the sampled voltage and provides it as the output voltage across capacitor C1, switch SW0 is closed. Note that closing switch SW0 pulls the drain of transistor SW4 and the source of transistor SW3 down to the ground voltage as shown or, generally in other embodiments, to a voltage lower than the held voltage.

In some embodiments, switch SW0 is controlled via a controller (not shown). By applying a control signal, the controller may cause switch SW0 to be opened or closed, depending on whether S/H circuit 20 is sampling or holding. In exemplary embodiments, the controller also controls switch SW1, switch SW3, and switch SW4.

In various embodiments, the controller may be implemented in a variety of ways, as persons of ordinary skill in the art will understand. Without limitation, examples include finite state machines, general logic controllers or circuits, and the like, as desired, and as persons of ordinary skill in the art will understand.

In some embodiments, the controller may be a host. The host may take a variety of forms and include a variety of circuitry, as persons of ordinary skill in the art will understand. Without limitation, the host may be a processor, MCU, and the like, as persons of ordinary skill in the art will understand.

The host may communicate with or interface with switch SW0. By applying a control signal, the host may cause switch SW0 to be opened or closed, depending on whether S/H circuit 20 is sampling or holding.

In some embodiments, a control signal may be applied directly to switch SW0, without using a controller or host. In this situation, the user of S/H circuit 20 or a circuit under the control of the user or other source, may apply a control signal to cause switch SW0 to open or close, as described above. Similar arrangements may be used for switches SW1, SW3, and SW4.

Switch SW0, and generally other switches in S/H circuit 20, may be implemented in a variety of ways, as persons of ordinary skill in the art will understand. Without limitation, the switches may be implemented using MOSFETs, as desired. In the example shown in FIG. 2, switches SW1, SW3, and SW4 are realized using p-channel MOSFETs.

During the sample mode, the gates of transistors SW1, SW3, and SW4 are coupled to circuit ground. As a result, the input voltage (the voltage to be sampled, provided by input circuit 13) is coupled across capacitor C1, and is therefore sampled. Sampling of the input voltage takes place when transistor SW1 turns off (its gate voltage is raised from ground voltage to a voltage higher than the sampled voltage, such as the supply voltage).

During the hold mode, the gates of transistors SW3 and SW4 are coupled to the supply voltage (which causes transistors SW3 and SW4 to turn off). The bulk of transistor SW1 is coupled to diode DN and to the source of transistor SW1, as well as the drain of transistor SW3. The gate of transistor SW1 is also coupled to the supply voltage, which turns off transistor SW1.

Diode DN is a parasitic diode, present when S/H circuit is implemented in an IC. More specifically, diode DN represents the junction between the n-well that includes transistor SW1 and the p-type substrate when S/H circuit 20 is realized as part of an IC, such as a complementary metal oxide semiconductor (CMOS) IC.

Note that input circuit 13 may be included in S/H circuit 20, as shown in the exemplary embodiments in FIG. 2, or it may be omitted from S/H circuit 20, and an external input circuit may be used. Broadly speaking, input circuit 13 is the circuit that generates the voltage to be sampled, or makes that voltage available to the S/H circuit. Once the voltage is sampled, the output of input circuit 13 may have any arbitrary value, such as ground voltage, supply voltage, or a voltage in between those voltages.

Figure 3B:
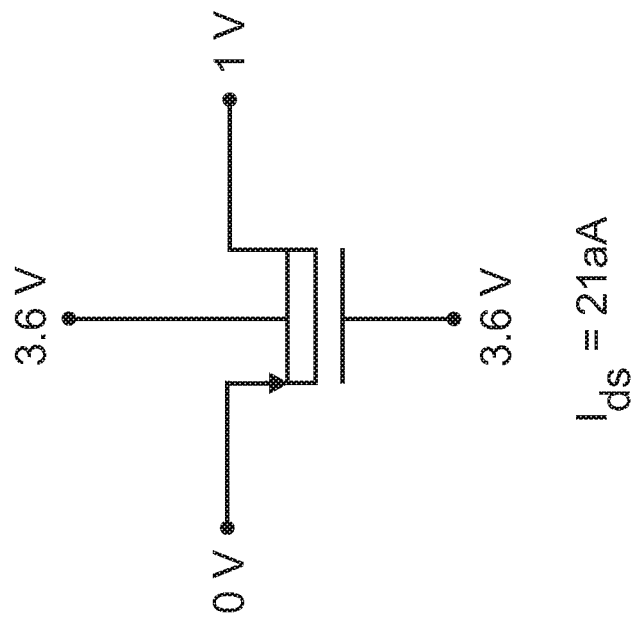
FIGS. 3A-3B show circuit conditions used for characterizing leakage currents in S/H circuits.
Figure 3A:
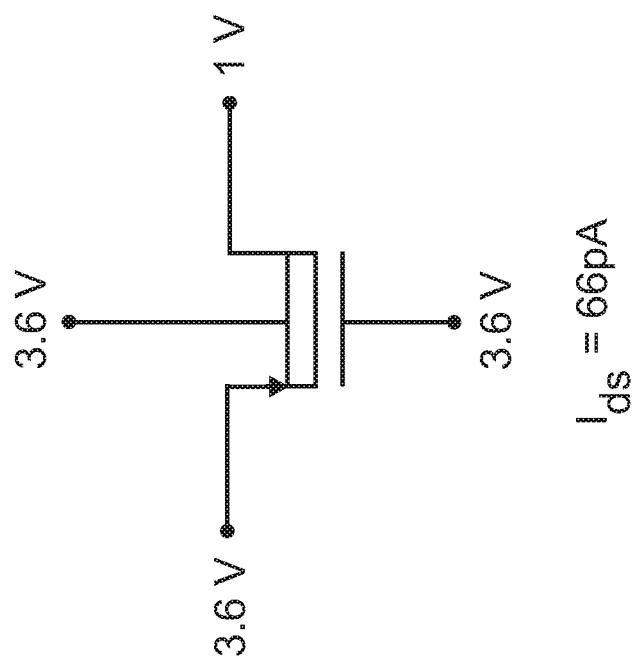

FIGS. 3A and 3B show circuit conditions used to characterize via circuit simulation the reduction in sub-threshold leakage current. More specifically, the figures show a test bench for two minimum-size PMOS switches (p-channel MOSFETs) with drain voltage of 1 volt, bulk and gate voltages of 3.6 volts, but with differing source voltages.

The source voltage of the MOSFET in FIG. 3A is 3.6 volts, whereas the source voltage in FIG. 3B is zero volts (ground potential). Consequently, the sub-threshold current is found to be reduced from 66.5 pA in FIG. 3A to 68$e$-39A in FIG. B. The simulation was performed at 135° C. and fast process corner. If a 1.5-volt supply voltage is used, the sub-threshold in the MOSFET in FIG. 3B will become 21 aA, which can be ignored compared to other currents in S/H circuit 20.

Another leakage current that can reduce the hold time of S/H circuits is the GIDL current of transistor(s) used as switches in S/H circuits. In MOSFETs, such as p-channel (PMOS) transistors, GIDL current appears when the gate-drain voltage is large (gate voltage is relatively large compared to the drain voltage), which is common in PMOS samplers (e.g., switch SW2 in FIG. 1) in hold mode (the gate is high (supply voltage) in order for the PMOS transistor to turn off).

In such a situation, the GIDL current flows from the bulk to the held node. On the other hand, in n-channel (NMOS) transistors used as samplers, the GIDL current flows when the drain-gate voltage is large (drain voltage is relatively high compared to the gate voltage).

This situation is relatively common in S/H circuits when the sampling switch is turned off by pulling the gate to ground, and holding the drain voltage. In this case, the GIDL current is introduced by the low gate voltage (relative to the drain voltage) and the GIDL current flows from the drain of the transistor to its bulk.

Figure 4:
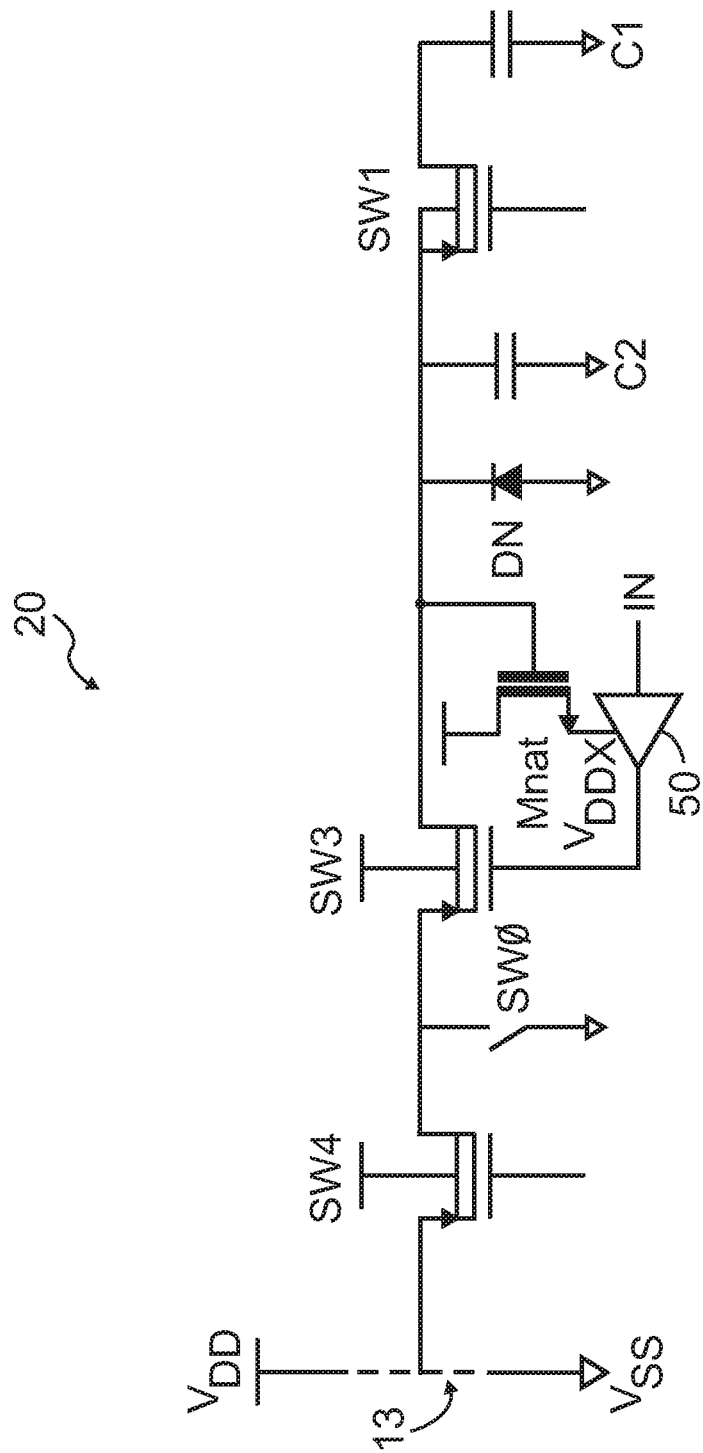
FIG. 4 shows a S/H circuit according to another exemplary embodiment.

One aspect of the disclosure relates to reducing or eliminating (or nearly eliminating, in a practical implementation) GIDL currents in S/H circuits. FIG. 4 shows a S/H circuit 20 with reduced GIDL current according to an exemplary embodiment.

S/H circuit 20 in FIG. 4 is similar to the S/H circuit in FIG. 2, but it has an additional buffer 50 and native transistor Mnat. S/H circuit 20 in FIG. 4 reduces or eliminates the GIDL current of the transistor used to implement switch SW3.

The reduction or elimination of the GIDL current is accomplished by limiting the gate voltage of the transistor used to implement switch SW3. In other words, the GIDL current, which is caused by the relatively high gate-drain voltage, e.g., in a PMOS transistor, is reduced or eliminated by limiting the gate voltage when the transistor is off.

Referring to FIG. 4, the technique used keeps the gate voltage within a certain value, say, one volt, higher than the drain voltage, but not higher. In such a scenario, the root cause of the GIDL current (gate voltage being substantially (e.g., more than one volt, say, 3 volts) higher than the drain voltage) is reduced or eliminated.

Limiting the gate voltage is achieved as follows. The gate of the SW3 is driven by a digital buffer 50, whose input is a digital control signal, labeled IN in FIG. 4. The digital control signal has digital or binary value of either "0" or "1" in order to disable or enable buffer 50.

Buffer 50 uses a different supply voltage than does the rest of S/H circuit 20. More specifically, S/H circuit 20 generally uses supply voltage $V_{DD}$. Buffer 50, however, uses another supply voltage, $V_{DDX}$. Supply voltage $V_{DD}$ has values that can be relatively high compared to the held voltage (drain voltage of transistor SW3) and, if applied to the gate of switch SW3, would introduce GIDL currents.

Supply voltage $V_{DDX}$ is provided by the source of NMOS native transistor Mnat. The drain of native transistor Mnat is coupled to the supply voltage $V_{DD}$. The gate of native transistor Mnat is driven by the drain of transistor SW3.

As persons of ordinary skill in the art understand, native transistors, like transistor Mnat, have negative threshold voltages. Consequently, when there is no current flowing through the device, the voltage of its source is higher than its gate voltage by one threshold voltage (which is typically less than one volt in some current semiconductor-fabrication technologies).

Because there is no current flowing through transistor Mnat, the gate voltage of transistor SW3 will be higher than its drain voltage (the held node or the held voltage in S/H circuit 20) by a threshold voltage of native transistor Mnat. Given that the gate-drain voltage of transistor SW3 is now limited to the threshold voltage of native transistor Mnat, GIDL leakage current in transistor SW3 is reduced or eliminated.

To turn off transistor SW3 from the source side as well (as the drain side), the source of transistor SW3 is pulled to ground using switch SW0, as described above. Consequently, the gate-source junction of transistor SW3 is completely off (or nearly completely off in a practical implementation).

Figure 5:
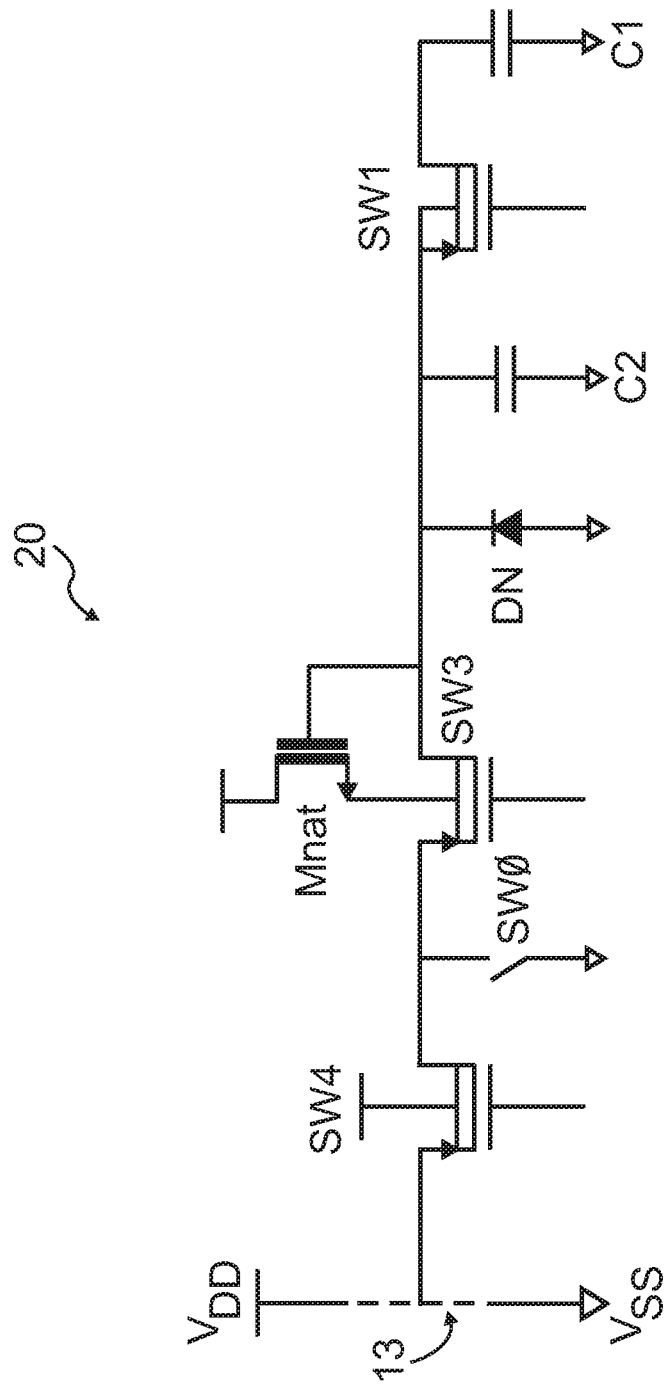
FIG. 5 shows a S/H circuit according to another exemplary embodiment.

FIG. 5 shows a S/H circuit 20 with reduced GIDL current according to another exemplary embodiment. S/H circuit 20 reduces the effect of GIDL current, rather than attempt to eliminate it. More specifically, GIDL current causes a leakage current to flow from the bulk of transistor SW3 to its drain through the bulk-drain junction (reverse junction current). To reduce that leakage current, S/H circuit 20 in FIG. 5 limits the voltage across the bulk-drain junction.

To do so, S/H circuit 20 in FIG. 5 uses a native transistor Mnat. The drain of native transistor Mnat is coupled to the supply voltage. The source and gate of native transistor Mnat are coupled, respectively, to the bulk and drain of transistor SW3. In other words, the bulk-drain voltage of transistor SW3 is the source-gate voltage of native transistor Mnat.

Native transistor Mnat operates as follows. Assume that $V_d$ represents the drain voltage of transistor SW3, i.e., the held voltage of S/H circuit 20. In the absence of native transistor Mnat, the bulk-drain voltage of transistor SW3 would be the supply voltage minus the voltage $V_d$. With native transistor Mnat used in the circuit as shown in FIG. 5, however, the bulk-drain voltage of transistor SW3 would be the source-gate voltage of native transistor Mnat.

Similar to S/H circuit 20 in FIG. 4, the gate of native transistor Mnat is driven by the drain voltage of transistor SW3. The source voltage of native transistor Mnat is higher than its gate by one threshold voltage (of native transistor Mnat), which is usually less than one volt (e.g., using typical currently available semiconductor-fabrication technologies).

Thus, the voltage across the bulk-drain junction of transistor SW3 is limited to a ceiling of one volt, instead of the supply voltage minus the held voltage, as described above. In other words, use of native transistor Mnat helps to reduce the GIDL current.

To summarize, the circuit arrangement in FIG. 4 reduces or eliminates the source of the GIDL current, i.e., the relatively large gate-drain voltage. The circuit arrangement in FIG. 5 limits the voltage across the bulk-drain junction, reduces the GIDL current.

Note that, in some embodiments, the techniques shown in FIGS. 4 and 5 may be combined, as desired, and as persons of ordinary skill in the art will understand. In such embodiments, two native transistors Mnat may be used, as shown in the circuit arrangements in FIGS. 4-5, respectively. Furthermore, one native transistor can be used, where its gate is coupled to the drain of transistor SW3, its drain is coupled to the supply, and its source is coupled to the bulk of transistor SW3 and to the supply voltage ($V_{DDX}$) of the buffer 50.

FIGS. 6A-6C show circuit conditions used to characterize via circuit simulation the reduction in GIDL current using the techniques described above. More specifically, the figures show a test bench for quantifying the effect on GIDL currents of the techniques described above.

Referring to FIGS. 6A-6C, the ordinary (non-native) transistors represent transistor SW3 in FIGS. 4-5, whereas the native transistor represents native transistors Mnat in FIGS. 4-5. In FIG. 6A, transistor SW3 is biased such that its gate voltage is 3.6 volts (the supply voltage used in the simulation), the drain voltage is 1 volt (the held voltage), and the source voltage is 0 volts (ground potential). In this scenario, the GIDL current is about 80 fA.

In FIG. 6B, the GIDL reduction technique shown in FIG. 5 is used. The transistor representing switch SW3 has a gate voltage of 3.6 volts, a source voltage of 0 volts, and a drain voltage of 1 volt (similar to FIG. 6A). Referring again to FIG. 6B, the bulk voltage of the transistor representing switch SW3, however, is supplied by the source of native transistor Mnat. In this case, the GIDL current is about 0.78 fA, representing a relatively large reduction from the 80 fA found for the arrangement in FIG. 6A.

In FIG. 6C, the GILD reduction or elimination technique shown in FIG. 4 is used. The transistor representing switch SW3 has a gate voltage supplied by the source of native transistor Mnat, a source voltage of 0 volts, and a drain voltage of 1 volt (the same voltage driving the gate of native transistor Mnat). In this case, simulation results show that the GIDL current is about 0 fA, which indicates that the GIDL current is eliminated.

One aspect of the disclosure concerns applying the leakage-current reduction/elimination techniques described above to circuits other than S/H circuits. More specifically, the techniques may be applied to any circuit that has a switch in the open or off condition, where reduction or minimization of leakage current in the switch is desired.

As an example, the techniques may be applied to power switches, i.e., switches that selectively supply power from a source (e.g., a supply voltage) to a load or, generally, a circuit. For relatively large levels of power supplied via such switches (in the closed condition), the leakage currents when in the off or open condition (power-down condition) can be relatively large. The techniques discussed above can be used to reduce the power-down current contributed by GIDL.

Figure 7C:
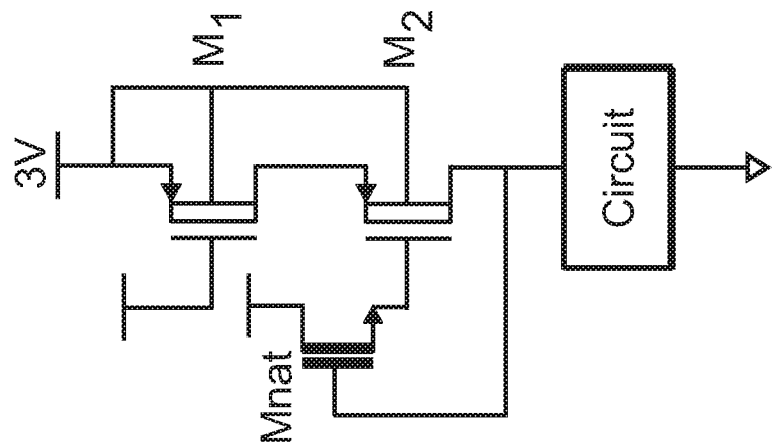
FIGS. 7A-7C show circuit arrangements related to techniques for reducing leakage currents.
Figure 7B:
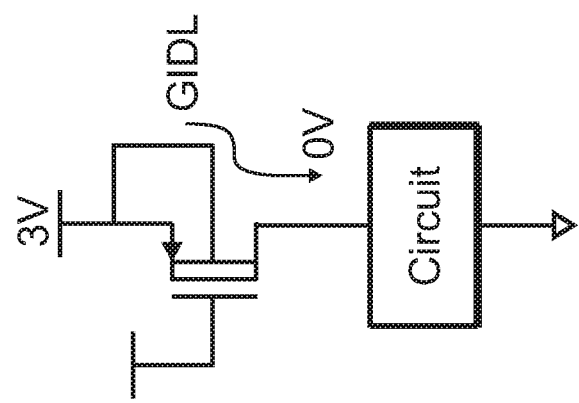
Figure 7A:
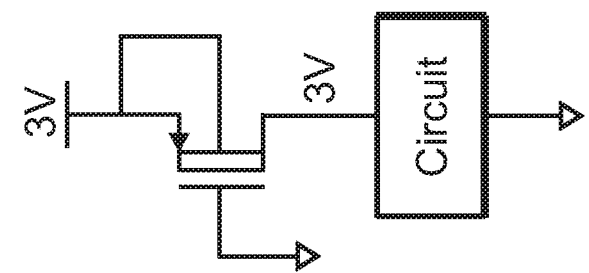

FIG. 7A shows a transistor supplying power to a circuit. More specifically, the transistor, acting as a switch, supplies power from a 3-volt (or other desired voltage) supply voltage to a circuit (e.g., a load). When the transistor is on, current flows from the supply voltage source to the circuit. The transistor is usually sized to have relatively voltage drops across its drain and source, which results in a voltage of about 3 volts to be applied to the circuit.

FIG. 7B shows the situation when the transistor acting as the power switch is turned off. In this situation, the drain voltage of the transistor is at ground voltage (or nearly at ground voltage), whereas the gate voltage is 3 volts (the gate voltage is raised to the supply voltage to turn off the transistor). As a result, GIDL currents are introduced, given that the gate voltage is relatively large compared to the drain voltage ($V_g >> V_d$).

FIG. 7C show a circuit arrangement for reducing the GIDL current according to an exemplary embodiment. Two switches, implemented as MOSFETs $M_1$ and $M_2$ and a native transistor Mnat, are used in the exemplary embodiment shown. Switches $M_1$ and $M_2$ are used to implement a power switch, i.e., take the place of the single MOSFET used in FIGS. 7A-7B. Native transistor Mnat is used to bias transistor $M_2$ in order to reduce or eliminate GIDL current.

In the power-down condition (no power supplied to the circuit coupled to the drain of transistor M2), switch $M_1$ is turned off by the application of the supply voltage (3 volts in the example shown) to its gate, while switch $M_2$ is turned off by the application of the source voltage of the native transistor to its gate.

The gate of native transistor Mnat is driven by the drain voltage of transistor $M_2$, which is the ground voltage in the power-down condition. The source of native transistor Mnat is one threshold voltage above the gate voltage (ground voltage). Since the source of native transistor Mnat is coupled to the gate of transistor M2, the source of transistor M2 (which is coupled to the drain of transistor M1) will have a voltage equal to one native threshold voltage (threshold voltage of a native transistor) plus the threshold voltage of transistor M2.

In this scenario, the drain voltage of transistor $M_1$ is no longer pulled all the way down to the ground potential, as was the case in FIG. 7B. As a result, transistor $M_1$ will no longer conduct relatively large GIDL currents, as is the case in FIG. 7B. Note that transistor $M_2$ will also not conduct any appreciable GIDL current because its gate-drain voltage is limited by the threshold voltage of native transistor Mnat.

Figure 8:
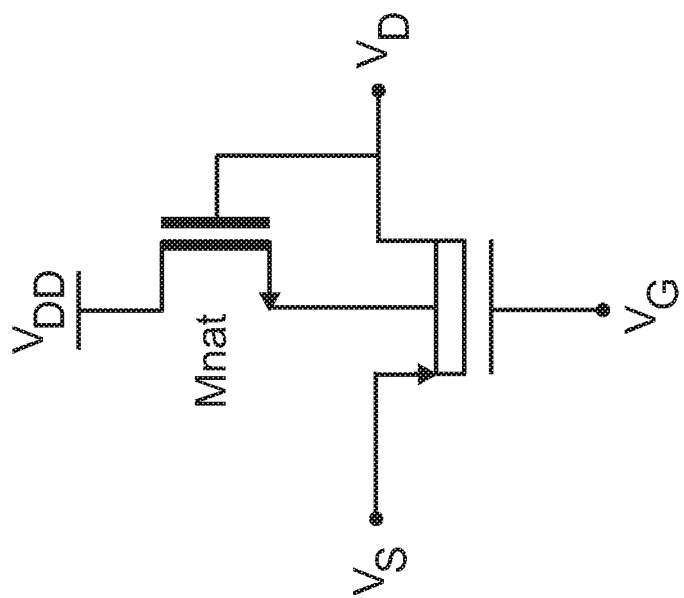
FIG. 8 shows a circuit arrangement for reducing leakage current according to an exemplary embodiment.

One aspect of the disclosure relates to body-drain leakage current in S/H circuits. FIG. 8 shows a circuit arrangement for reducing that current according to an exemplary embodiment.

More specifically, the circuit arrangement reduces the bulk-drain diode current by limiting the bulk voltage itself. In FIG. 8, the MOSFET, which can be used to implement any of the switches shown in FIGS. 2, 4, and 5 (e.g., transistor SW3) or other S/H circuits, has a gate voltage $V_G$, a drain voltage $V_D$, and a source voltage $V_S$.

The bulk voltage of the transistor, however, is provided by native transistor Mnat. More specifically, the source voltage of native transistor Mnat drives the bulk of the MOSFET used as a switch. The drain of native transistor Mnat is coupled to the supply voltage, whereas the gate of native transistor Mnat is coupled to the drain of the MOSFET.

Thus, the bulk-drain voltage of the MOSFET equals $|V_{thnat}|$, where $V_{thnat}$ denotes the threshold voltage of native transistor Mnat. As a result, the bulk-drain diode current of the MOSFET is reduced.

Figure 9B:
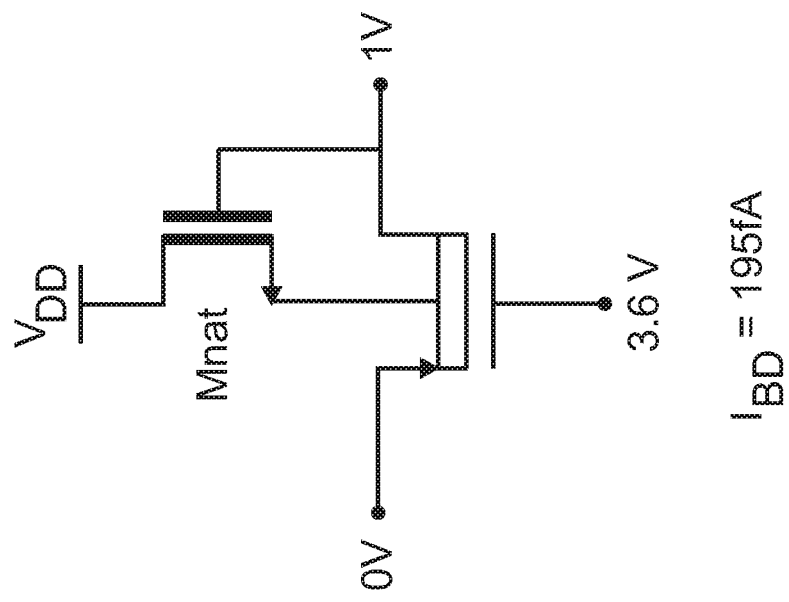
FIGS. 9A-9B show circuit arrangements used for characterizing leakage currents in S/H circuits.
Figure 9A:
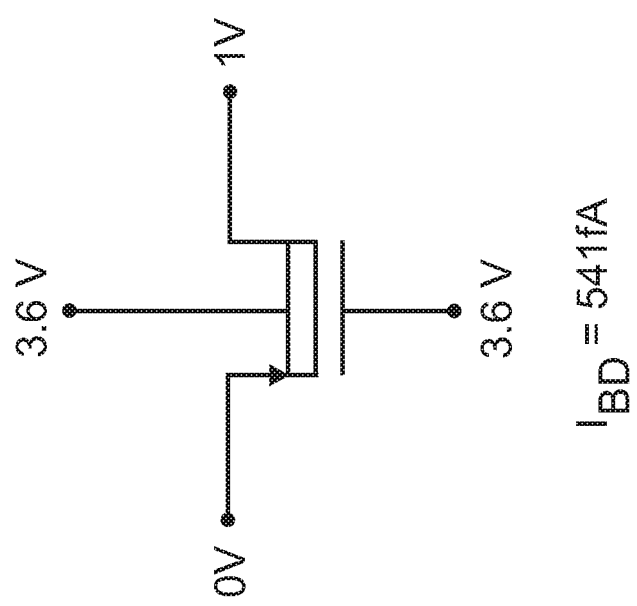

FIGS. 9A-9B show circuit arrangements used for characterizing leakage currents in S/H circuits. More specifically, FIG. 9A shows the bias conditions for a transistor in a conventional S/H circuit, such as the S/H circuit in FIG. 1. Here, the bulk voltage of the transistor is 3.6 volts, whereas the drain voltage is one volt (e.g., the held voltage). Simulation at 135° C. and fast process corner shows a bulk-drain diode current of 541 fA.

FIG. 9B shows a circuit arrangement according to the circuit in FIG. 8. More specifically, a native transistor Mnat is used to drive the bulk of the MOSFET. In this case, simulation shows a bulk-drain diode current of 195 fA. Thus, using the native transistor results in a relatively large reduction in the bulk-drain diode leakage current.

Figure 10:
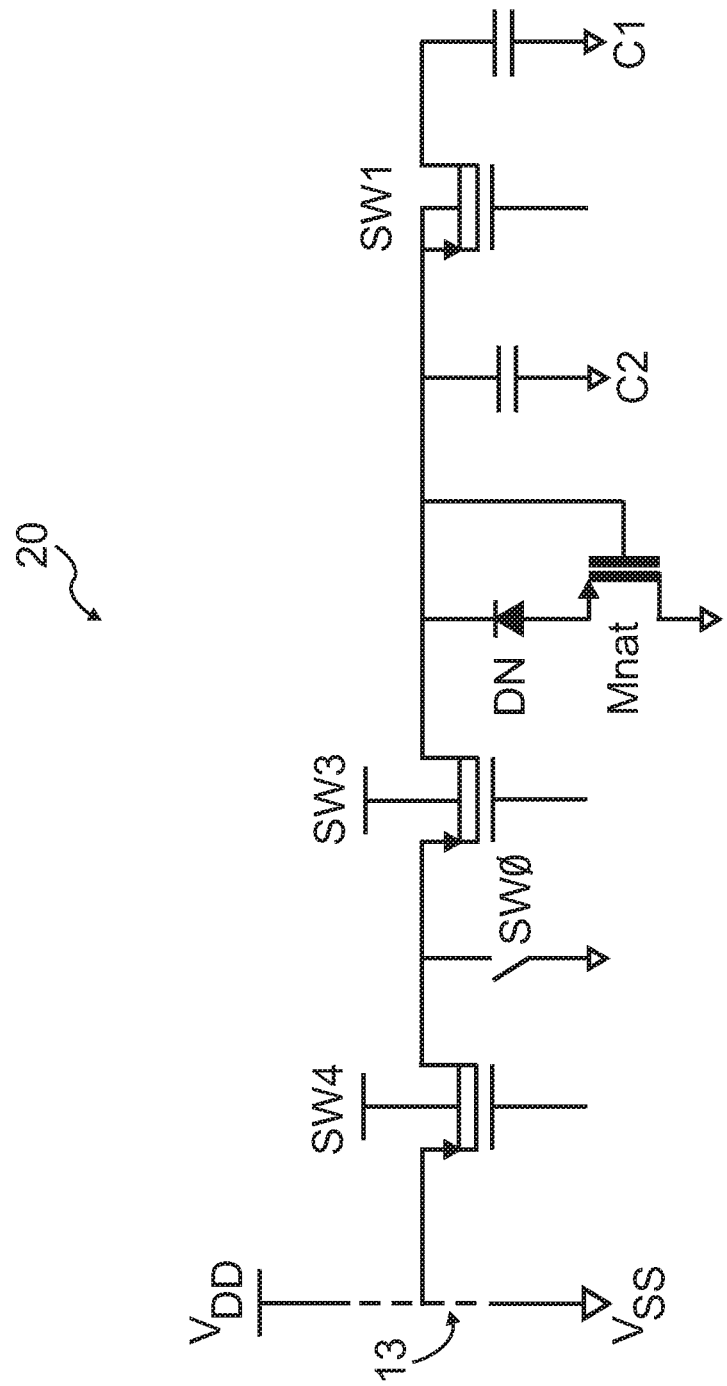
FIG. 10 shows a S/H circuit according to another exemplary embodiment.

One aspect of the disclosure relates to reduction of leakage current through diode DN. FIG. 10 shows a S/H circuit 20 according to an exemplary embodiment. S/H circuit 20 uses a native transistor Mnat to reduce the leakage current through parasitic diode DN.

Generally, the topology of S/H circuit 20 in FIG. 10 is similar to the topology of S/H circuit 20 in FIG. 2. S/H circuit 20 in FIG. 10, however, uses a native transistor Mnat coupled to diode DN. More specifically, the gate of native transistor Mnat is driven by the drain voltage of transistor SW3, whereas the source of native transistor Mnat is coupled to ground.

The source of native transistor Mnat is coupled in series with diode DN. Because the anode of diode DN is not grounded and instead is coupled to, and driven by, the source of native transistor Mnat, the diode current is reduced. In the case of a PMOS sampler (or sampling) transistor (e.g., transistor SW1 in the exemplary embodiment shown), a PMOS native transistor Mnat is used. Conversely, in the case of an NMOS sampler transistor, an NMOS native transistor may be used.

In some situations, depending on factors such as available technology, cost, etc., native transistors may be unavailable for some implementations. In such cases, the native transistor in FIG. 10 may be replaced with a source-follower circuit to generate a voltage that is higher (or lower, depending on the type of sampler transistor used) than the held voltage. (Source-follower circuits are well known to persons of ordinary skill in the art.) In exemplary embodiments, depending on factors such as design and performance specifications, the source-follower circuit may operate with nano-amperes of current to provide a relatively low overall power consumption for S/H circuit 20.

Figure 12:
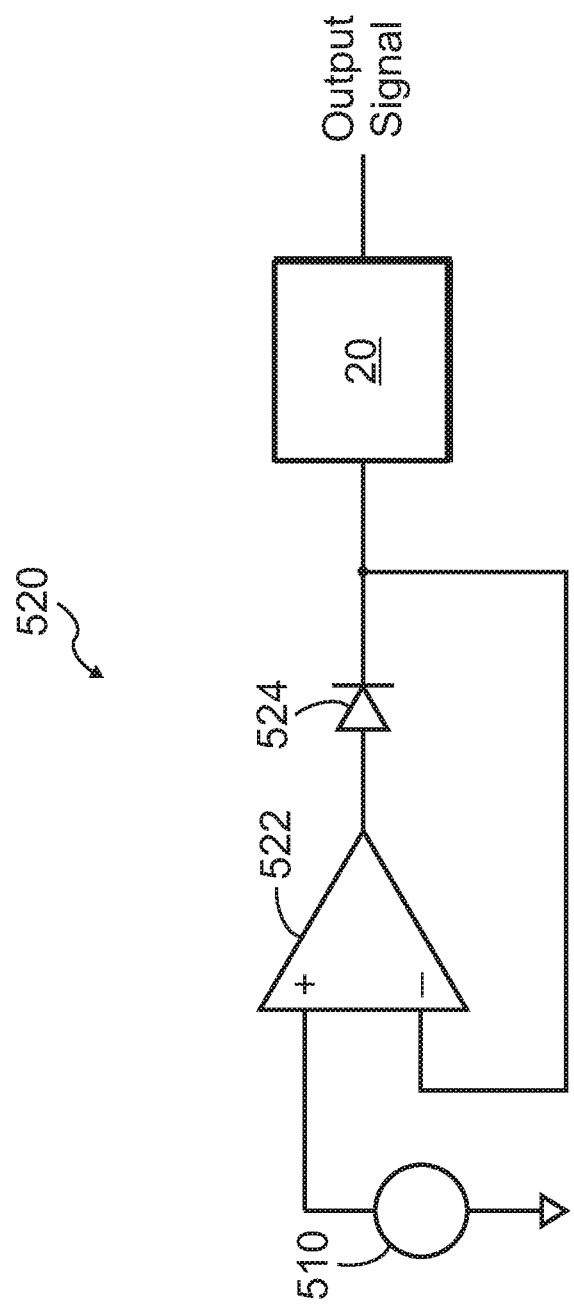
FIG. 12 shows a circuit arrangement for using a S/H circuit according to another exemplary embodiment.
Figure 13:
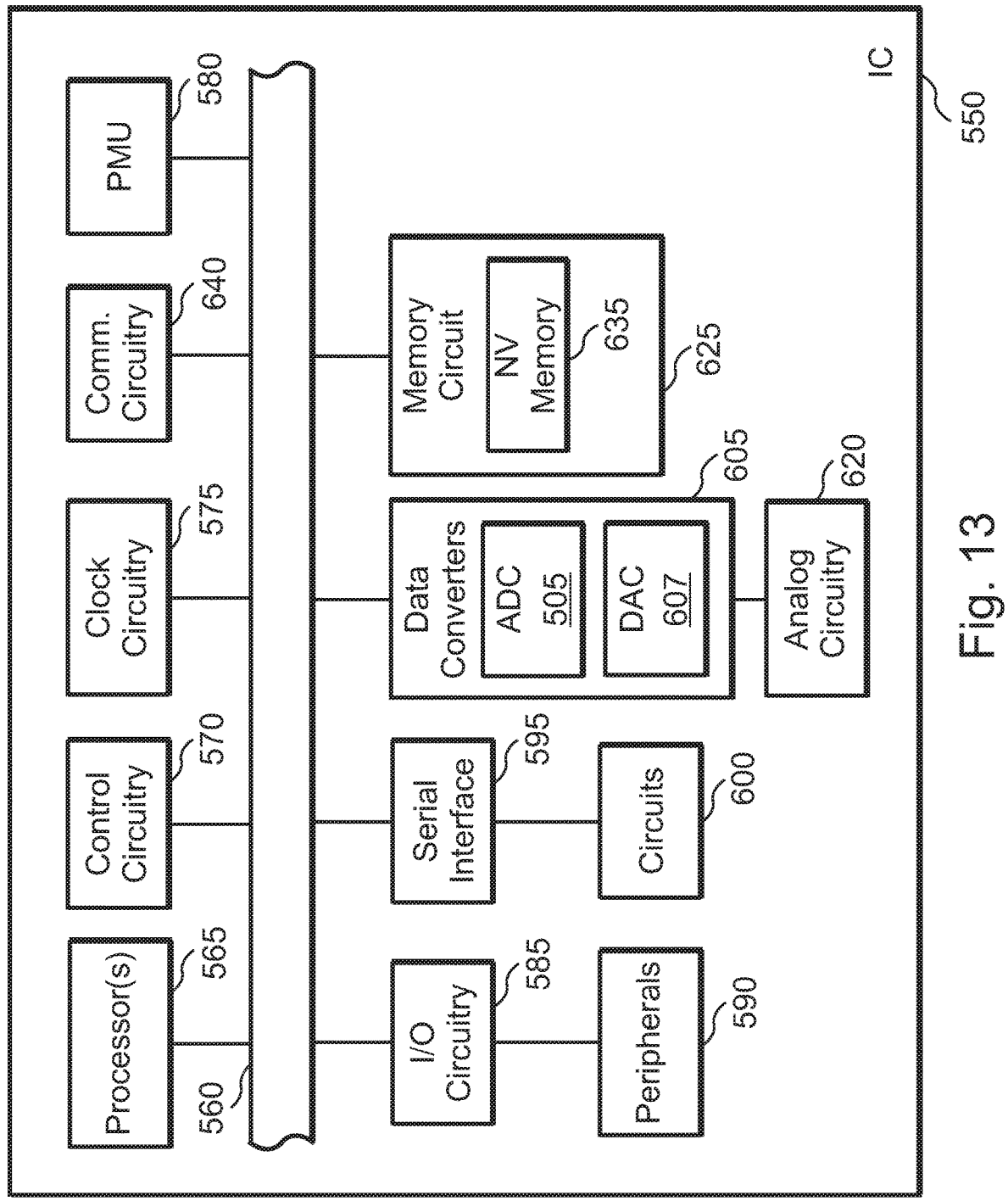
FIG. 13 shows a block diagram of an IC, including a microcontroller unit (MCU), according to an exemplary embodiment.

As noted, S/H circuits according to exemplary embodiments may be used in a variety of circuitry and applications. To illustrate, without limitation, FIGS. 11-13 provide some examples.

Figure 11:
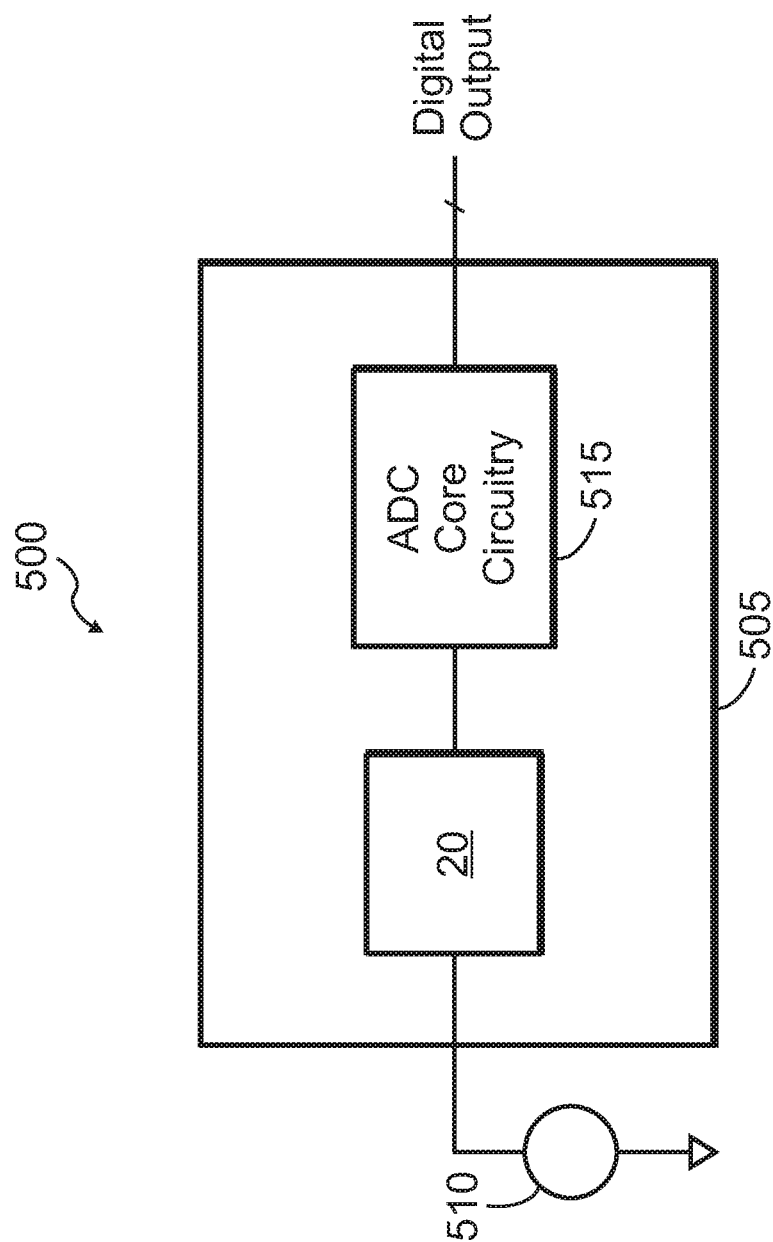
FIG. 11 shows a circuit arrangement for using a S/H circuit according to an exemplary embodiment.

FIG. 11 shows a circuit arrangement 500 for using an S/H circuit 20 according to an exemplary embodiment. More specifically, circuit arrangement 500 shows the use of S/H circuit 20 in an analog-to-digital converter (ADC 505).

ADC 505 converts an analog signal supplied by signal source 510 to a digital output signal. ADC 505 includes S/H circuit 20, and ADC core circuitry 515. S/H circuit 20 samples the signal supplied by signal source 510, and holds the sampled value. At various intervals in time, the sample and hold operation may be repeated, as desired.

In some embodiments, the sample and hold operation may be performed under the control of ADC core circuitry 515 or a controller (not shown) in ADC 505. In some embodiments, the sample and hold operation may be performed under the control of a controller or circuit external to ADC 505.

ADC core circuitry 505 uses the output signal of S/H circuit 20 as the analog signal that it converts to a digital format. ADC core circuitry 505 may use a variety of techniques to perform the analog to digital conversion, as persons of ordinary skill in the art will understand. In some embodiments, ADC core circuitry 505 may use a successive-approximation technique to perform the signal conversion.

FIG. 12 shows a circuit arrangement 520 for using an S/H circuit 20 according to another exemplary embodiment. More specifically, circuit arrangement 520 illustrates a peak detector circuit.

The peak detector circuit detects and holds the peak values of a signal supplied by signal source 510. An amplifier 522 receives the signal supplied by signal source 510 at its non-inverting input. A diode 524 couples the output of amplifier 522 to its inverting input.

Diode 524 also couples the output of amplifier 522 to the input of S/H circuit 20. In other words, S/H circuit 20 receives its input voltage from the output of amplifier 522 through diode 524. In response to a control signal from a controller (not shown), S/H circuit 20 samples the signal provided via diode 524. In response to the control signal (e.g., a change to indicate switching from the sample mode to the hold mode), S/H circuit 20 then holds the sampled signal, and provides the held signal as an output signal of the peak detector.

In some embodiments, one or more S/H circuits 20 may be integrated in an IC that includes an MCU. FIG. 13 shows a circuit arrangement 500 of such an embodiment.

Circuit arrangement 500 includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 505 and/or one or more DACs 607. The ADC(s) 505 receive analog signal(s) from analog circuitry 620, and convert the analog signal(s) to a digital format, which they communicate to one or more blocks coupled to link 560. In some embodiments, one or more of ADCs 505 includes one or more S/H circuits 20, as desired.

Analog circuitry 620 may include a wide variety of circuitry that provides and/or receives analog signals. Examples include sensors, transducers, buffers, amplifiers, comparators, etc., as persons of ordinary skill in the art will understand. In some embodiments, analog circuitry 620 may communicate with circuitry external to IC 550 to form more complex systems, sub-systems, control blocks, and information processing blocks, as desired. In some embodiments, analog circuitry 620 includes one or more S/H circuits 20, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580 to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance or configuration of one or more blocks in IC 550.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
a sample-and-hold (S/H) circuit, comprising:
  a first switch coupled to provide an input signal to be sampled;
  a second switch coupled to the first switch and to a first capacitor, wherein a gate of the second switch is coupled to a buffer, and wherein the buffer is coupled to a supply voltage provided by a native transistor;
  a third switch to provide the input signal to a second capacitor; and
  a fourth switch to selectively couple to ground a node between the first and second switches.

2. The apparatus according to claim 1, wherein the fourth switch is closed during a hold mode of the S/H circuit.

3. The apparatus according to claim 2, wherein the fourth switch is open during a sample mode of the S/H circuit.

4. The apparatus according to claim 1, wherein the first, second, third, and fourth switches comprise, respectively, first, second, third, and fourth metal semiconductor field effect transistors (MOSFETs).

5. The apparatus according to claim 1, wherein a bulk of the second switch is coupled to a source of a native transistor, and wherein a drain of the second switch is coupled to a gate of the native transistor.

6. The apparatus according to claim 1, further comprising a diode coupled to the second switch and to a source of a native transistor, wherein a gate of the native transistor is coupled to the second switch.

7. A method of using a sample and hold (S/H) circuit having a sample mode and a hold mode, the method comprising:
providing, by using a first switch, an input signal to be sampled;
using a second switch to provide the input signal to a first capacitor;
supplying a gate voltage of the second switch by using a buffer;
supplying power to the buffer by using a native transistor;
using a third switch to provide the input signal to a second capacitor; and
selectively coupling, by using a fourth switch, to ground a node between the first and second switches.

8. The method according to claim 7, wherein selectively coupling, by using the fourth switch, to ground the node between the first and second switches further comprises closing the fourth switch during the hold mode of the S/H circuit.

9. The method according to claim 7, wherein selectively coupling, by using the fourth switch, to ground the node between the first and second switches further comprises opening the fourth switch during the sample mode of the S/H circuit.

10. The method according to claim 7, further comprising:
driving a bulk of the second switch by a source of a native transistor; and
driving a gate of the native transistor by a drain of the second switch.

11. The method according to claim 7, further comprising driving, by using a native transistor, a diode coupled to the second switch, wherein a gate of the native transistor is coupled to the second switch.

12. The method according to claim 7, wherein the first, second, third, and fourth switches comprise, respectively, first, second, third, and fourth metal semiconductor field effect transistors (MOSFETs).

13. The apparatus according to claim 1, wherein a drain of the native transistor is coupled to the supply voltage.

14. The apparatus according to claim 13, wherein a source of the native transistor supplies power to the buffer.

15. The apparatus according to claim 5, wherein a drain of the native transistor is coupled to a supply voltage.

16. The apparatus according to claim 6, wherein the diode is coupled to a drain of the second switch.

17. The apparatus according to claim 16, wherein a drain of the native transistor is coupled to ground.

18. The apparatus according to claim 6, wherein the gate of the native transistor is coupled to a drain of the second switch.

19. The method according to claim 7, wherein a drain of the native transistor is coupled to the supply voltage.

20. The method according to claim 7, wherein a source of the native transistor supplies power to the buffer.

* * * * *